(12) United States Patent
Tanghe et al.

(10) Patent No.: US 11,206,016 B2
(45) Date of Patent: Dec. 21, 2021

(54) GATE DRIVER WITH PULSED GATE SLEW CONTROL

(71) Applicant: Analog Devices International Unlimited Company, Limerick (IE)

(72) Inventors: Steven John Tanghe, Essex Junction, VT (US); Brian K. Jadus, Williston, VT (US); Kenneth Richardson, Erie, CO (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/586,299

(22) Filed: Sep. 27, 2019

(65) Prior Publication Data

US 2021/0099170 A1  Apr. 1, 2021

(51) Int. Cl.
*H03K 3/00* (2006.01)
*H03K 17/60* (2006.01)
*H03K 17/567* (2006.01)
*H03K 17/687* (2006.01)
*H03K 17/16* (2006.01)

(52) U.S. Cl.
CPC .................................. *H03K 17/165* (2013.01)

(58) Field of Classification Search
CPC .................................................. H03K 17/165
See application file for complete search history.

(56) References Cited

U.S. PATENT DOCUMENTS

| | | | | |
|---|---|---|---|---|
| 5,140,201 A | * | 8/1992 | Uenishi | H03K 17/0406 327/108 |
| 5,397,878 A | * | 3/1995 | Chen | H03K 17/0406 219/661 |
| 6,323,717 B1 | * | 11/2001 | Omura | H03K 17/12 327/434 |
| 6,870,405 B2 | * | 3/2005 | Visser | C01B 13/115 327/108 |
| 7,242,238 B2 | * | 7/2007 | Higashi | H03K 17/0828 327/374 |
| 7,274,243 B2 | * | 9/2007 | Pace | H02M 7/538 327/396 |

(Continued)

OTHER PUBLICATIONS

"High Voltage, Isolated IGBT Gate Driver with Isolated Flyback Controller", Analog Devices Data Sheet, (2018), 24 pgs.

*Primary Examiner* — Kenneth B Wells
(74) *Attorney, Agent, or Firm* — Schwegman Lundberg & Woessner, P.A.

(57) ABSTRACT

A circuit to control a switching characteristic of a switching device. The circuit includes a driver circuit comprising an output port, where the driver circuit is configured to generate, at the output port, a control signal to actuate the switching device within a first time period. The control signal comprising at least one electrical pulse, where a pulse width of the at least one electrical pulse being shorter than the first time period. The circuit also includes a coupling circuit that is configured to use the control signal to actuate the switching device to establish a target switching characteristic of the switching device according to a modulation of the at least one electrical pulse. The control circuit is also configured to provide a greater impedance to the control signal than an impedance of the output terminal of the driver circuit.

24 Claims, 11 Drawing Sheets

(56) References Cited

U.S. PATENT DOCUMENTS

| | | | | |
|---|---|---|---|---|
| 7,440,301 B2* | 10/2008 | Kirchmeier | H01S 3/097 | 363/132 |
| 7,459,945 B2* | 12/2008 | Omura | H03K 17/04123 | 327/108 |
| 7,746,158 B2* | 6/2010 | Morishita | H02M 1/08 | 327/434 |
| 8,138,818 B2* | 3/2012 | Tsunoda | H03K 17/0406 | 327/108 |
| 8,319,529 B2* | 11/2012 | Ikeda | H03K 17/04123 | 327/108 |
| 8,350,601 B2* | 1/2013 | Nagata | H03K 17/168 | 327/108 |
| 8,362,812 B2* | 1/2013 | Lee | H02M 1/08 | 327/109 |
| 8,471,622 B2* | 6/2013 | Ishikawa | H03K 17/08128 | 327/108 |
| 8,519,751 B2* | 8/2013 | Kitamura | H03K 17/04106 | 327/109 |
| 8,531,212 B2* | 9/2013 | Dewa | H03K 17/063 | 327/108 |
| 8,717,068 B2* | 5/2014 | Wasekura | H03K 17/163 | 327/108 |
| 8,884,660 B2* | 11/2014 | Fukuta | H03K 17/00 | 327/109 |
| 8,957,648 B2* | 2/2015 | Wakii | H03K 17/6872 | 323/282 |
| 9,496,864 B2* | 11/2016 | Wagoner | H03K 17/163 | |
| 9,673,809 B1* | 6/2017 | Kandah | H03K 17/18 | |
| 9,685,945 B2* | 6/2017 | Osanai | H03K 17/567 | |
| 9,712,149 B2* | 7/2017 | Kaeriyama | H03K 17/0828 | |
| 10,291,222 B2* | 5/2019 | Morishita | H03K 17/08122 | |
| 10,361,147 B1* | 7/2019 | Xu | H01L 23/367 | |
| 10,491,095 B2* | 11/2019 | Chen | B60L 58/20 | |
| 2015/0077081 A1* | 3/2015 | Ejury | H02M 7/538 | 323/282 |

* cited by examiner

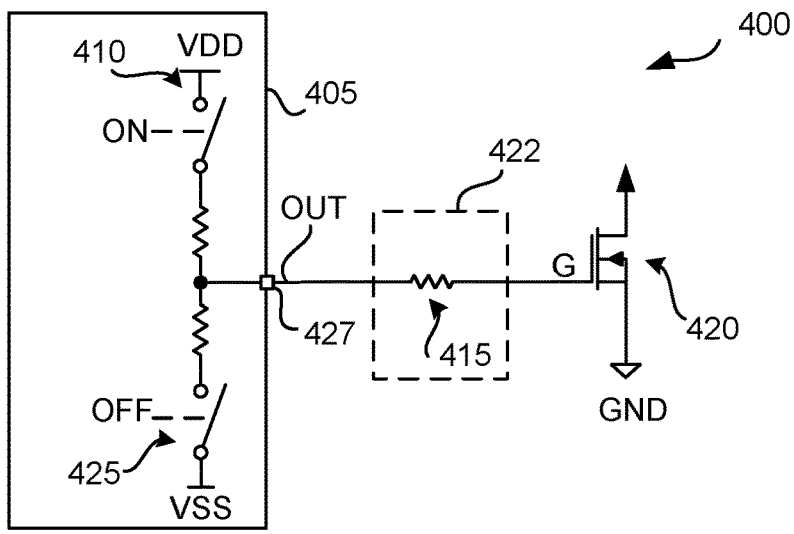
FIG. 4A
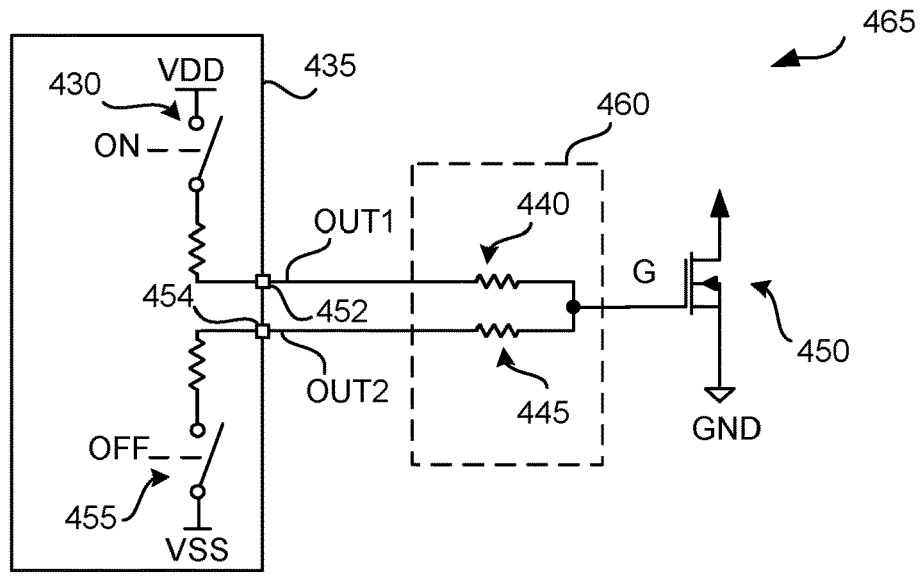
FIG. 4B
FIG. 4C

_US 11,206,016 B2_

GATE DRIVER WITH PULSED GATE SLEW CONTROL

FIELD OF THE DISCLOSURE

This document pertains generally, but not by way of limitation, to power switching circuits, and more particularly, to gate driver circuits for controlling a switching device.

BACKGROUND

Power switching circuits are used in applications such as power converters, motor drive circuits, and solar power inverters. These switching circuits can use electronic switching devices, such as power field effect transistors (FETs) and insulated-gate bipolar transistors (IGBTs), to control the distribution of power to other circuits or devices. In some cases, it is desirable to control the rate at which these switching devices turn-on or turn-off, such as to reduce ringing, electromagnetic interference, or voltage or current overshoot. Some techniques for controlling the turn-on and turn-off characteristics (e.g., rise times, fall times, or slew rates) of switching devices include tailoring or modulating the drive strength of the gate drivers used to actuate these devices. Such techniques, however, can increase power dissipation in the driver circuits and can result in excessive heating in switching circuits.

BRIEF DESCRIPTION OF THE DRAWINGS

FIG. 4A and FIG. 4B depict example systems having resistive coupling circuits for coupling a gate driver circuit to a switching device, according to various embodiments.

FIG. 4C depicts a diagram of signals associated with a system having resistive coupling circuits for coupling a gate driver circuit to a switching device, according to various examples.

Figure 1:
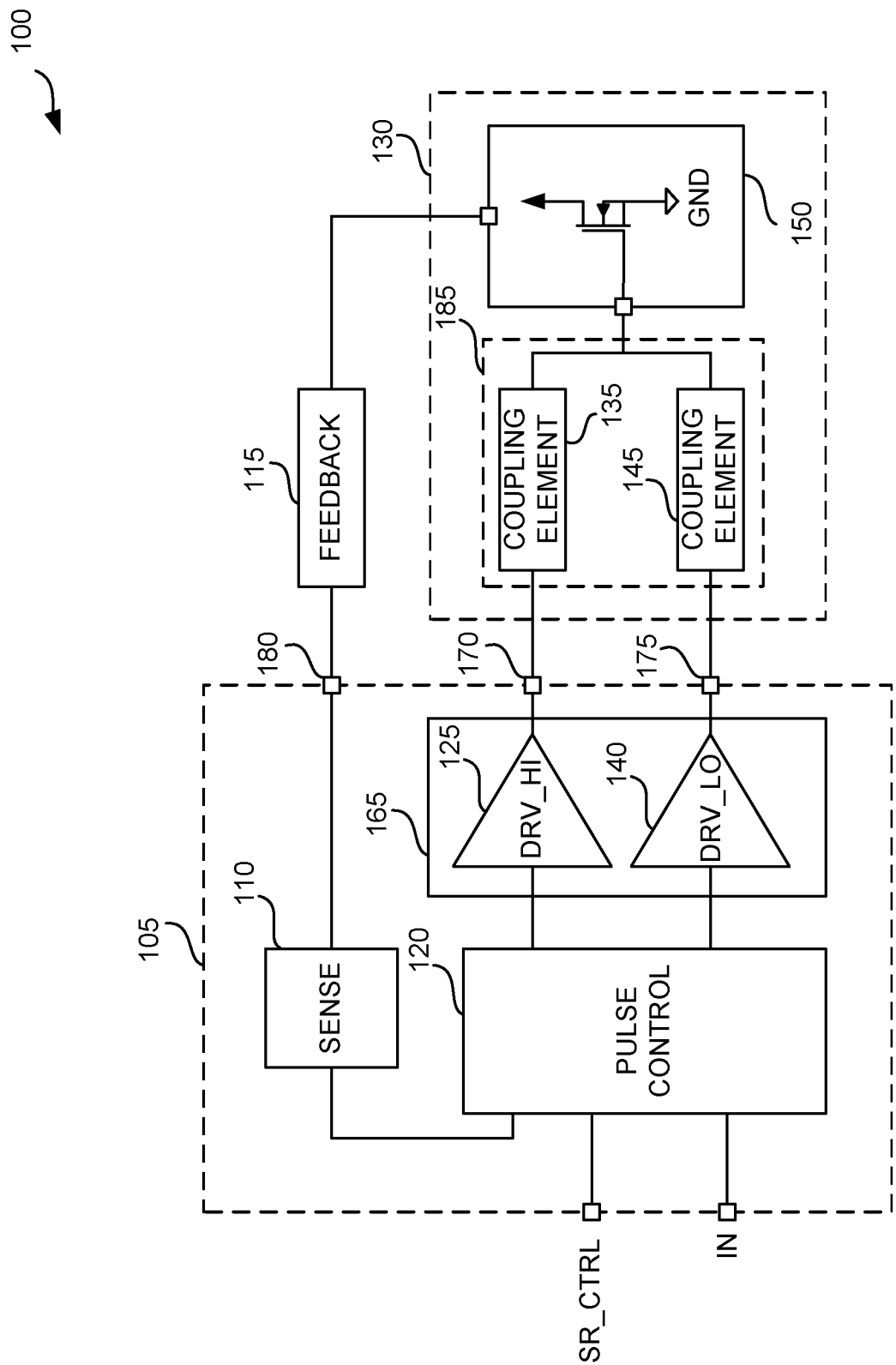
FIG. 1 depicts a block diagram of an example of a system having a gate driver circuit that is configured to control a switching device, according to various examples.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure includes a gate driver circuit that controls the turn-on or turn-off time, slew rate, or gate voltage profile of a switching device, such as by using a pulsed drive signal to reduce power dissipation within the gate driver circuit. The gate driver circuit can deliver pulses of current through an external gate resistor (or other circuit element having a resistive component) to drive the gate, or other control terminal, of the switching device at a rate that is controllable by a modulation of the pulse in the pulsed drive. Using this technique, more power can be dissipated in the external gate resistor than in the gate driver, resulting in cooler operation of the gate driver circuit. The gate driver circuit disclosed herein can be used to manufacture power converters, motor drive circuits, and solar power inverters that are cheaper to cool, have with wider operating ranges, and longer operating life.

As used herein, a switching device, switch, or switching circuit can include a circuit including one or more transistors that have a control terminal, such as a gate, that can be driven by a gate driver circuit. In some examples, a switching device can include high-power transistors, such as power FETs, IGBTs, or high electron mobility transistors. In some examples, a switching device can be depicted as a switch and a resistor that is indicative of an internal resistance or impedance of the switching device.

As used herein, the term switching profile can refer to any electrical or switching characteristic of a controlled switching device. Such electrical characteristics can include the turn-on time, turn-off time, slew rate, or gate or control voltage profile of a switching device. In an example, such electrical or switching characteristics include the rise time or the fall time of a gate voltage of a switching device, such as a transistor. In another example, such electrical or switching characteristics include the rise time or the fall time of a drain voltage or drain current of a switching device. The term voltage profile can generally refer to the magnitude of a voltage as a function of time or another parameter.

As used herein, a pulsed signal, or a pulse modulated signal, can include a signal having one or more electrical pulses, such as a current or a voltage pulse, that is modulated or capable of being modulated according to one or more pulse density modulation techniques. Such pulse density modulation techniques can include modulating the pulse width, the duty cycle, the duration, or the frequency of the one or more pulses.

Referring to the figures, FIG. 1 depicts a block diagram of an example of a system 100 having a gate driver circuit 105 that is configured to control a switching device 150. The system 100 can include a gate driver circuit 105, a feedback circuit 115, or a load circuit 130. The system 100 can represent a general application of a switching system or circuit in which a control signal, such as a low current signal driven by an output of a microcontroller or other logic circuit, is used to drive a load, such as the gate capacitance of a switching device. Such switching systems can use a gate driver or power amplifier circuit, such as the gate driver circuit 105, as an interface between the control signal and the load. In some examples, the gate driver circuit 105 is included in an integrated circuit, while the load circuit 130 is included in another circuit that is external to the integrated circuit.

The gate driver circuit 105 can include any circuit that is configured to receive a lower-power, or low current, input signal and generate a high-current output signal to drive a gate of a switching device, such as by charging and discharging a gate capacitance associated with the switching device. Such circuits can internally dissipate a large amount of power due to the output resistance of the circuits and the high drive current. The gate driver circuit 105, however, can mitigate such internal heating by using a pulse modulated signal (hereinafter, "pulsed signal") to drive the gate of a switching device 150. The pulsed signal can be coupled to the power transistor through an external circuit or circuit element that has an electrical impedance that is larger than the output resistance of the gate driver circuit 105, thereby concentrating power dissipation in the external circuit. The gate driver circuit 105 can be configured to modulate the pulses of the pulsed signal to control the turn-on and turn-off characteristics of the power transistor. Such characteristics can include the turn-on time, turn-off time, the profile of the rising or falling gate voltage, or any other aspects of the switching profile of the switching circuit 150. In an example, such characteristics include turn-on time, turn-off time, the profile of the rising or falling voltage or current profile of a drain of collector terminal of the switching circuit 150.

In some examples, the gate driver circuit 105 can operate in an open loop configuration, such as to modulate the pulsed signal according to a predetermined pattern based on an input control signal. In other examples, the gate driver circuit 105 can operate in a closed loop configuration to modulate the pulsed signal according to an input control signal, a predetermined pattern, or a feedback signal, such as a signal detected by the switching circuit 150.

The gate driver circuit 105 can generate, or use, a pulsed signal to drive a switching circuit 150 by causing the pulsed signal to charge the gate of the switching circuit 150 (e.g., the gate capacitance) to at least a threshold voltage required to cause the switching device to switch from a first state, such as an off-state (e.g., a low voltage level or negative, such as VSS), to another state, such as an on-state (e.g., a high voltage level, such as VDD). The gate driver circuit 105 can also generate, or use, a pulsed signal to drive the switching circuit 150 by causing the pulsed signal to discharge the gate of the switching circuit 150 (e.g., the gate capacitance) to a voltage below a threshold voltage required to cause the switching circuit 150 to switch from a first state to another state.

The gate driver circuit 105 can include a sensing circuit 110, a pulse control circuit 120, and a driver circuit 165. In some examples, the driver circuit 165 can include a high-side driver circuit 125 and a low-side driver circuit 140. The high-side driver circuit 125 can include a puilup driver to drive the switching circuit 150 to a first power supply rail, such as VDD. The low-side driver circuit 125 can include a pulldown driver to drive the switching circuit 150 to a second power supply rail, such as VSS, where VSS is at a lower voltage than VDD and GNI) (e.g., a third or common power supply rail). In some examples, VSS is at a same voltage as GND. In other examples VSS and GND are the same power supply rail.

In some examples, the gate driver circuit 105, and other circuits discussed in this disclosure, can include an integrated circuit that is fabricated using one or more semiconductor fabrication technologies or processes. Such fabrication technologies can include processes for fabricating bipolar, complementary metal oxide semiconductor (CMOS), bipolar-CMOS (BiCMOS), or high electron mobility semiconductor devices. In other examples, the gate driver circuit 105, and other circuits discussed in this disclosure, can be constructed from one or more discrete components.

The sensing circuit 110 can include one or more circuits, or circuit elements, that are configured to detect and process a feedback signal that is received from the load circuit 130, such as though the feedback circuit 115. Such processing can include electrically conditioning the feedback signal to normalize the feedback signal according to an indicated specification. Such processing can also include providing the conditioned feedback signal to the pulse control circuit 120. The feedback signal can include a voltage, or a change in voltage, in the load circuit 130, such as at the drain or gate of the switching device 150. In some examples, the feedback signal can include a current, or an indication of a current, flowing through the switching device 150. In some examples, such current can include a drain-to-source current ($I_{DS}$) of a MOSFET transistor associated with the switching device 150. In some examples, the sensing circuit 110 can include an operational amplifier or a comparator circuit that scales or compares the feedback signal to a reference signal.

The pulse control circuit 120 can include one or more circuits that are configured to generate a pulsed signal for driving the load circuit 130, such as to control the switching characteristics or switching profile of the switching device 150. The pulse control circuit 120 can modulate the pulsed signal according to one or more pulse density modulation techniques, such as by modulating the duty cycle, duration, or the pulse width of pulses within the pulse modulated signal. In some examples, the pulse control circuit 120 can modulate the pulsed signal according to one or more predetermined patterns, such as a pattern or sequence stored in a memory circuit that is included in, or associated with, the pulse control circuit 120. Such patterns can be selected to generate a pulsed signal such that it can cause the switching circuit 150 to have a switching profile that is optimized for an indicated application. In some examples, the pulse control circuit 120 can modulate the pulsed signal according to one or more modulation patterns defined in one or more logic or memory circuits that are included in, or associated with, the pulse control circuit 120.

In some examples, the pulse control circuit 120 generates (e.g., modulates) the pulsed signal according to input received from one or more input control signals. The pulse control circuit 120 can use such control signals to select a modulation technique or a predetermined modulation pattern for use in generating the pulsed signal. In certain examples, the pulse control circuit 120 uses a slew-rate control signal SR_CTRL to select a modulation technique or modulation pattern that drives the switching device 150 to turn on or off with an indicated rise time, fall time, or slew-rate. In some examples, the pulse control circuit 120 uses the input control signal IN to select a modulation technique or modulation pattern to charge or discharge the gate of the switching device 150 according to an indicated switching profile. The pulse control circuit 120 can also use feedback detected by the sensing circuit 110 to control the modulation of the pulsed signal, such as to adjust the modulation to meet a target slew rate, switching profile, or another other target switching characteristic.

The pulse control circuit 120 can generate the pulsed signal by toggling or pulsing the driver circuit 165 on or off according to a selected pulse modulation pattern or pulse modulation technique. In some examples, the pulse control circuit 120 generates a pulsed signal to drive the gate voltage of the switching circuit 150 high with a slew rate indicated by SR_CTRL by toggling the high-side driver 125 on or off according an indicated pulse modulation pattern. Similarly, the pulse control circuit 120 can generate a pulsed signal to drive the switching circuit 150 low with a rate indicated by SR_CTRL by toggling the low-side driver 140 on or off according to an indicated pulse modulation pattern.

In some examples, the high-side driver 125 includes a first switching device, such as a pull-up FET, while the low-side driver 140 can include a second switching device, such as a pull-down FET. In these examples, the pulse control circuit 120 toggles or pulses the high-side driver 125 or the low-side driver 140 by driving their gate terminals to an appropriate switching voltage. The gate driver circuit 105 can generate a pulsed signal for driving the switching circuit 150 high or low at terminals 170 or 175, respectively. In certain examples, terminals 170 and 175 can be a single terminal.

The feedback circuit 115 can include one or more circuits, or circuit elements, that are configured to provide feedback on the state of the load 130, such as while the switching device 150 is being driven or actuated by the gate driver circuit 105. In some examples, the feedback circuit 115 includes a high impedance circuit element, such as a larger resistor. In certain examples, the feedback circuit 115 includes an electrical path that couples the drain or gate of the switching device 150 to the sensing circuit 110, such as through the terminal 180. In some examples, the terminal 180 is an independent feedback terminal. In other examples, the terminal 180 is shared with a miller clamp terminal.

The load circuit 130 can include a coupling circuit 185 and a switching device 150. The coupling circuit 185 can include one or more circuits or circuit elements 135 and 145 that are configured to couple the pulsed signal generated by the gate driver circuit 105 to the switching device 150. The circuit 135 can have an impedance that is larger than the output resistance of the gate driver circuit 105 and can couple the pulsed signal generated at the output of high-side driver 125 to the switching circuit 150. Similarly, the circuit 145 can have an impedance that is larger than the output resistance of the gate driver circuit 105 and can couple the pulsed signal generated at the output of low-side driver 140 to the switching device 150. The larger impedance of the circuit 185 and the circuit 145, relative to the output impedance or resistance of the driver circuit 165, enables most of the power of the pulsed signal generated by the pulse control circuit 120 to be dissipated in the coupling circuit 185 rather than in an integrated circuit including the gate driver circuit 105.

Figure 2A:
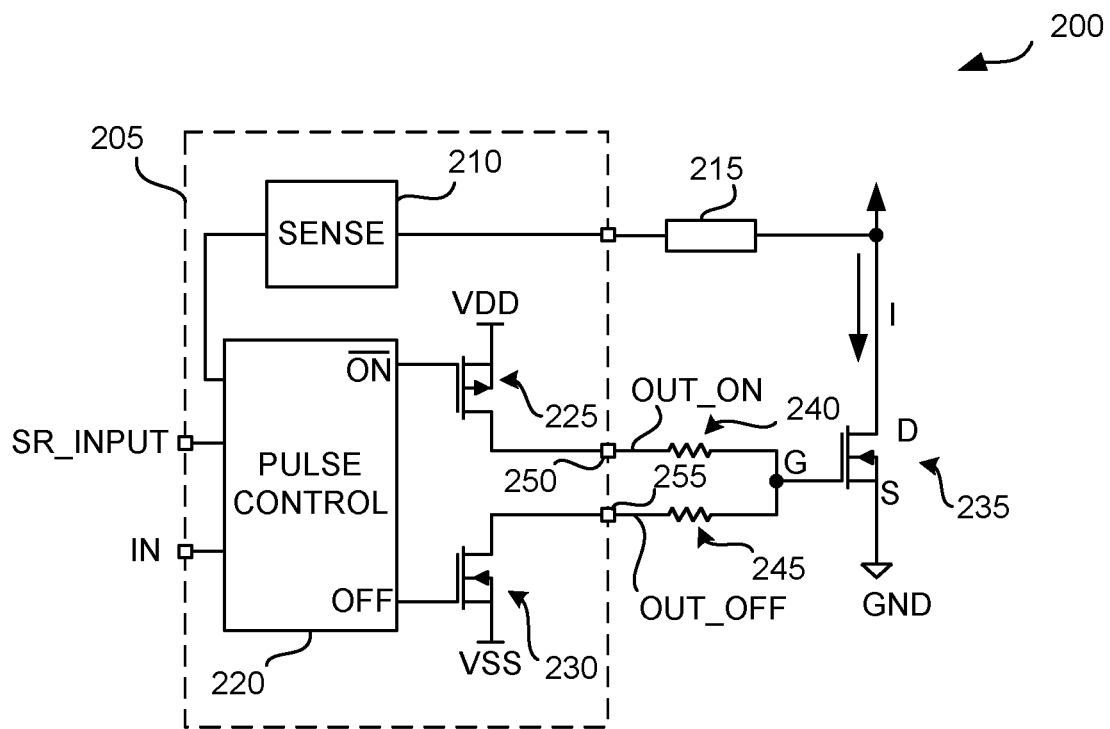
FIG. 2A depicts a block diagram of an example of a system having a gate driver circuit that is configured to control a switching device using off chip resistors, according to various examples.

FIG. 2A depicts a block diagram of an example of a system 200 having a gate driver circuit 205 that is configured to control a switching device 235 using resistors 240 and 245, according to various examples. The system 200 can be an example of an implementation of the system 100 (FIG. 1). The pulse control circuit 220 can generate pulsed control signals ON and OFF to drive switching device 225 (e.g., a high-side driver or a pull-up FET) and switching device 230 (e.g., a low-side driver or pull-down FET), such as to generate pulsed signals OUT_ON and OUT_OFF at terminals 250 and 255, respectively. The pulsed signals OUT_ON and OUT_OFF can drive the load circuit 130 formed by resistors 240 and 245, and switching device 235 (e.g., a switching circuit, such as the switching circuit 150). The resistors 240 and 245 can form a coupling circuit 185 that is configured to couple the pulse modulated signal from the gate driver 205 to the gate of the switching device 235. In some examples, the resistors 240 and 245 each have a resistance that is substantially larger than the output resistance of the switching devices 225 and 230.

In some examples, the feedback circuit element 215 provides a sampled version of the drain to source current I or the drain to source voltage of the switching device 235 to the sensing circuit 210, such as to enable closed loop control gate driver 205.

Figure 2B:
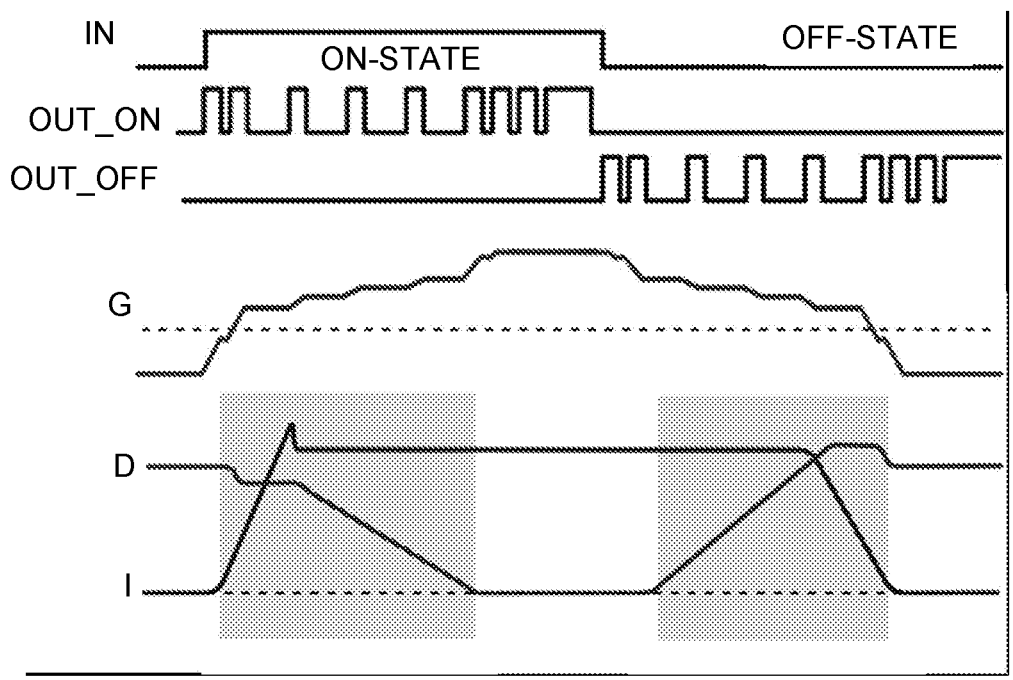
FIG. 2B depicts a diagram of signals associated with a system having a gate driver that is configured to control a switching device, according to various examples.

FIG. 2B depicts a diagram of signals associated with a system having a gate driver circuit 205 that is configured to control a switching device 235, according to various examples. The signals (e.g., voltage and current profiles or curves) shown in the FIG. 2B include examples of signals generated during the operation of the system 200. As shown in FIG. 2B, the input control signal IN can be toggled between an on-state and an off-state to cause the gate driver circuit 205 to generate the pulsed signal OUT_ON at terminal 250 or the pulsed signal OUT_OFF at terminal 255. While IN is set to an on-state, the voltage at the gate G (e.g., a control terminal) of the switching device 235 can increase, such as by charging the gate capacitance of switching device 235 through switching device 225. The voltage at the gate G (e.g., a gate-to-source voltage) can have a voltage profile that is established, or determined, by the pulse modulation pattern indicated by the pulsed signal OUT_ON. While IN is set to an off-state, the voltage at the gate G can fall, such as by discharging the gate capacitance of the switching device 235 through switching device 230, with a voltage profile that is determined by the pulse pattern indicated by the pulsed signal OUT_OFF. A voltage at the drain D of switching device 235 (e.g., a drain-to-source voltage) and a current I (e.g., a drain current) flowing into the drain D can exhibit a characteristic curve that depends on the physical characteristics of switching device 235 and the pulsed signals OUT_ON and OUT_OFF. In some examples, the pulsed signals OUT_ON and OUT_OFF are modulated according to a pulse pattern that is selected for influencing the voltage profile (e.g., curve) of the voltage at the drain D or the current profile of the current I. In certain examples, the voltage at the drain D or the current I are sampled and fed back to the gate driver 205, where they are used to adjust the modulation of OUT_ON or OUT_OFF, thereby adjusting or controlling the shape of the voltage profile of voltage at the gate G.

Figure 3A:
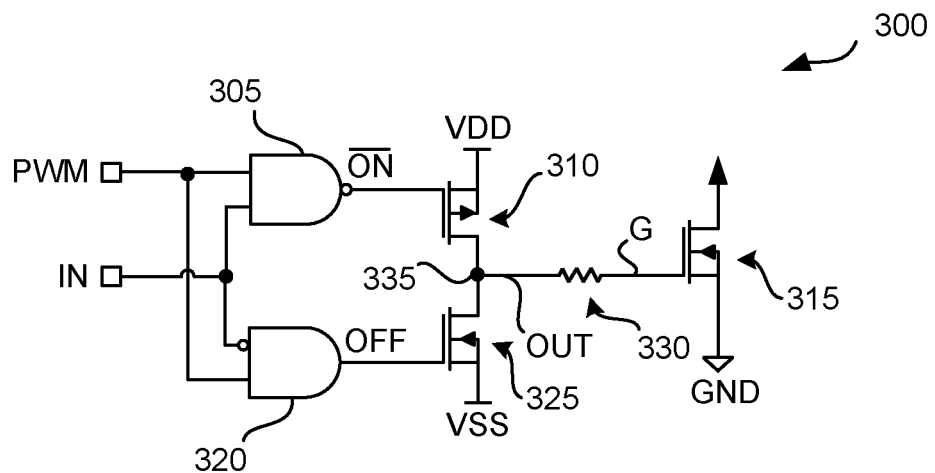
FIG. 3A depicts a block diagram of an example of a system having a gate driver circuit that is configured to control a switching device using an off chip resistor, according to various examples.

FIG. 3A depicts a block diagram of an example of a system 300 having a gate driver circuit that is configured to control a switching device 315 using resistor 330, according to various examples. The system 300 can be an example of the system 100 (FIG. 1) or the system 200 (FIG. 2A) and can include an integrated circuit gate driver formed by logic circuit 305, logic circuit 320, switching device 310 (e.g., a pull-up FET), and switching device 325 (e.g., a pull-down FET). The logic circuit 305 and the logic circuit 320 can form a combinational logic-based pulse control circuit, such as the pulse control circuit 220 (FIG. 2A) that is configured to generate a pulsed signal OUT according to a pulse width modulated control signal PWM and an input control signal IN. The resistor 345 can couple the pulsed signal to the gate of the switching device 315. In some examples, the resistor 330 has a resistance that is substantially larger than the output resistance of the switching devices 310 and 325.

In some examples, the system 300 includes a feedback circuit (not shown) that provides a sampled version of the drain voltage or drain current or gate voltage of the switching device 315 to a sensing circuit, such as the sensing circuit 210 (FIG. 2A), to enable closed loop control.

Figure 3B:
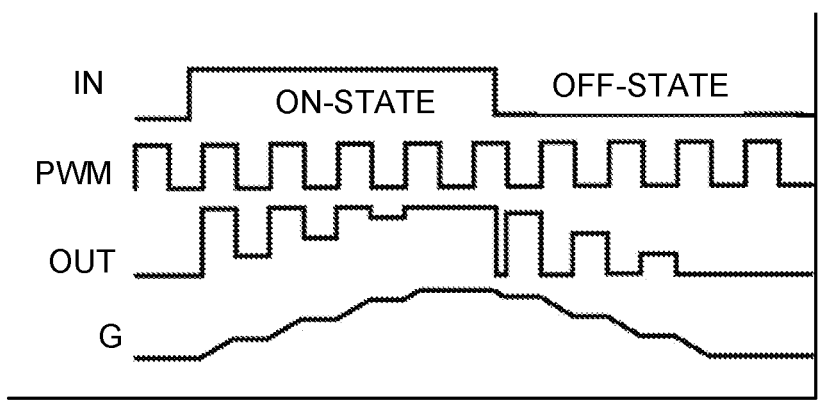
FIG. 3B depicts a diagram of signals associated with a system having a gate driver circuit that is configured to control a switching device, according to various examples.

FIG. 3B depicts a diagram of signals associated with a system having a gate driver circuit that is configured to control a switching device 315, according to various examples. The signals shown in the FIG. 3B can include examples of signals generated during the operation of the system 300. As shown in FIG. 3B, the input control signal IN can be toggled between an on-state and an off-state to cause the gate driver circuit to generate the pulsed signal OUT at node 335. While IN is set to an on-state, the voltage at the gate G of switching device 315 can rise, such as by charging the gate capacitance of switching device 315 through the switching device 310, with a voltage profile determined by PWM. While IN is set to an off-state, the voltage on the gate G of switching device 315 can fall, such as by discharging the gate capacitance of switching device 315 through switching device 325, with a voltage profile determined by PWM. In some examples, the duty cycle of the PWM signal can be increased or decreased to increase or decrease the switching slew rate of the switching device 315. The curve of the pulsed signal OUT depicts voltage measured at node 335 during the charging and discharging of the gate capacitance of the switching device 315.

FIG. 4A and FIG. 4B depict examples of systems 400 and 465 having resistive coupling circuits 422 and 460 for coupling gate driver circuit 405 and 435 to switching devices 420 and 450. The gate driver circuit 405 or the gate driver circuit 435 can be an example of the gate driver circuit 105 (FIG. 1) or the gate driver circuit 205 (FIG. 2A). FIG. 4A illustrates an example of a single ended or single terminal coupling between the gate driver 405 and the switching device 420 using the resistor 415. According to the example shown in FIG. 4A, a pulsed signal OUT generated by the gate driver 405 can be coupled through terminal 427 and resistor 415 to the switching device 420, such as to enable to the gate driver 405 to use the pulsed signal to charge the gate capacitance of switching device 420 through the switching device 410 and to discharge the gate capacitance of switching device 420 through switching device 425. FIG. 4B illustrates an example of a dual ended or dual terminal coupling between the gate driver 435 and the switching device 450 using the resistors 440 and 445. According to the example shown in FIG. 4B, pulsed signals OUT1 and OUT2 generated by the gate driver 435 can be alternatively coupled through terminals 452 and 454 and resistors 440 and 445, such as to enable the gate driver 435 to use the pulse modulated signal to charge the gate capacitance of switching device 450 through switching device 430 and to discharge the gate capacitance of switching device 450 through switching device 455.

FIG. 4C depicts a diagram of signals associated with a system having resistive coupling circuits for coupling a gate driver circuit to a switching device, according to various examples. The signals shown in the FIG. 4C include examples of signals generated during the operation of the gate driver 405 or the gate driver 435. These signals substantially correspond to the signals depicted in FIGS. 2B and 3B.

In some examples, the system 400 and the system 465 can be operated in a closed loop configuration, such as by including feedback circuits (not shown) that provide sampled versions of the drain voltage, drain current, or gate voltage of the switching device 420 for closed loop control, as described in the discussion of FIG. 1 and FIG. 2A.

Figure 5A:
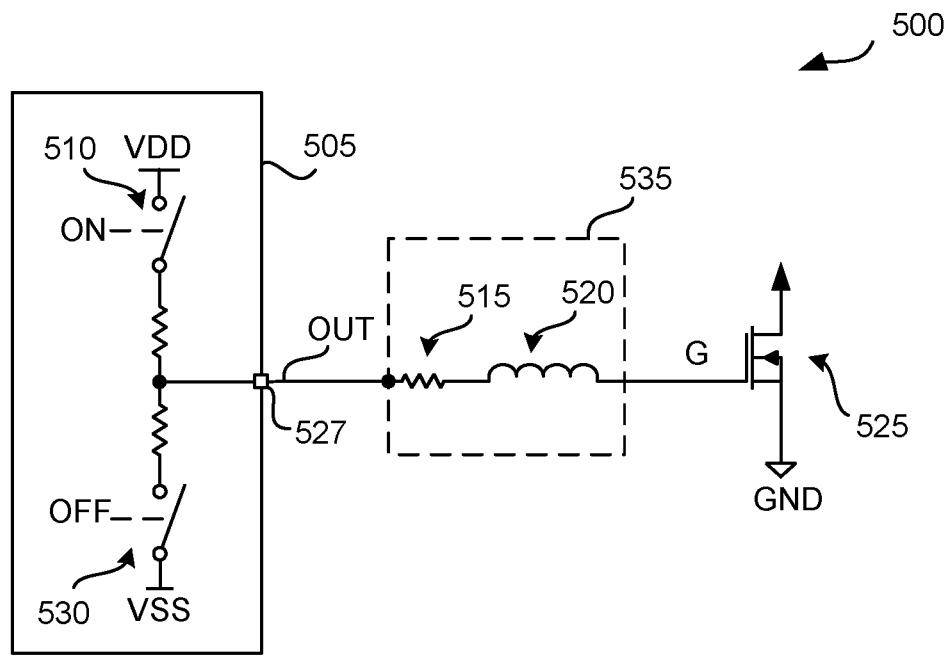
FIG. 5A depicts an example of a system having an inductive coupling circuit for coupling a driver circuit to a switching device, according to various embodiments.

FIG. 5A depicts an example of a system 500 having an inductive coupling circuit 535 for coupling a gate driver circuit 505 to a switching device 525. In some examples, inductive coupling circuit 535 reduces overall power dissipation in the system 500 as compared to systems that use resistive coupling circuits. As shown in FIG. 5A, a pulsed signal OUT generated by the gate driver 505 is coupled to the switching device 525 through terminal 527 and inductor 520, such as to enable the gate driver circuit 505 to charge the gate capacitance of switching device 525 through switching device 510 and to discharge the gate capacitance of switching device 525 through switching device 530. In some examples, the resistor 515 includes the internal resistance of the inductor 520. In other examples the resistor 515 includes a current limiting resistor or a damping resistor. The inductor 520 can be selected to have an impedance at an operating frequency of the gate driver 505, or a frequency of the pulsed signal OUT, that is substantially, larger than the output resistance of switching device 510 or switching device 530.

Figure 5B:
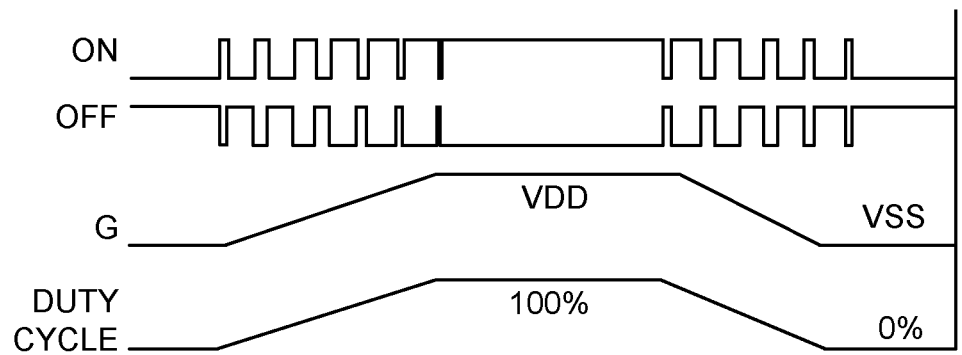
FIG. 5B depicts a diagram of signals associated with a system having an inductive coupling circuit for coupling a driver circuit to a switching device, according to various examples.

FIG. 5B depicts a diagram of signals associated with a system having an inductive coupling circuit for coupling a gate driver circuit to a switching device, according to various examples. Signals shown in the FIG. 5B include examples of signals generated during the operation of the system 500. As shown in FIG. 5B, a voltage at the gate G of the switching device 525 can be controlled by toggling (e.g., modulating) the actuation of switching device 510 and the switching device 530 according to pulsed signals ON and OFF. In some examples, the switching device 510 and the switching device 530 can be alternatively toggled, such as to prevent the devices from being damaged by back EMF generated by the inductor 520. The pulsed signals ON and OFF can be pulse modulated signals having a duty cycle which can be adjusted to establish, or determine, the rise/fall time, the slew rate, or the magnitude of the voltage at the gate G of the switching device 525.

In some examples, the system 500 can be operated in a closed loop configuration, such as by including feedback circuits (not shown) that provide sampled versions of the drain voltage, drain current, or gate voltage of the switching device 525 for closed loop control, as described in the discussion of FIG. 1 and FIG. 2A.

Figure 6A:
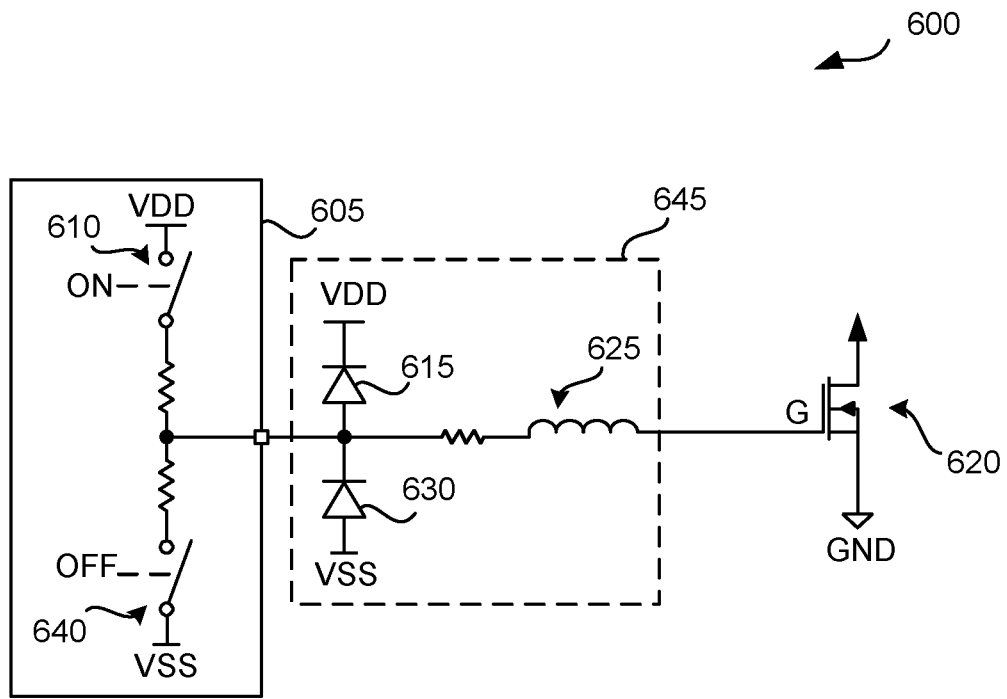
FIG. 6A depicts an example of a system having a clamped inductive coupling circuit for coupling a driver circuit to a switching device, according to various embodiments.

FIG. 6A depicts an example of a system 600 having a clamped inductive coupling circuit 645 for coupling a gate driver circuit 605 to a switching device 620. The coupling circuit 645 shown in FIG. 6A can be an example of the coupling circuit 535 (FIG. 5A). The flyback or clamping diodes 615 and 630 are configured to protect switching device 610 and 640 from back EMF generated by the switching of inductor 625. In some examples, the flyback or clamping diodes 615 and 630 are drain-to-body diodes of the switching devices 610 and 640. The use of the flyback or clamping diodes 615 and 630 can enable switching device 610 and switching device 640 to be independently toggled by pulsed signals ON and OFF, as shown in FIG. 6B.

Figure 6B:
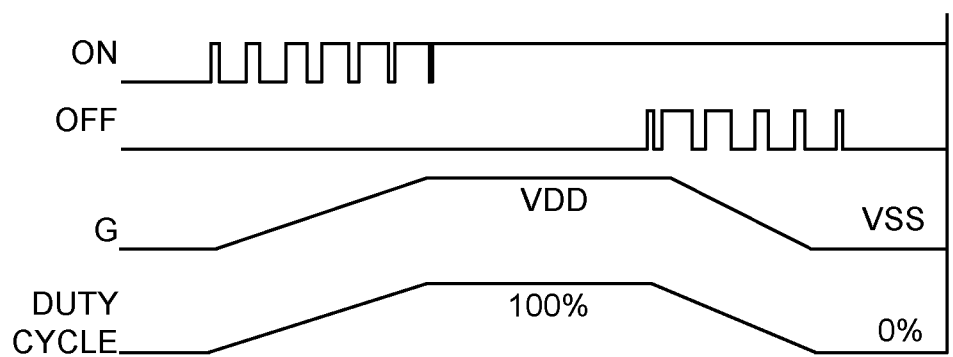
FIG. 6B depicts a diagram of signals associated with a system having a clamped inductive coupling circuit for coupling a driver circuit to a switching device, according to various examples.

FIG. 6B depicts a diagram of signals associated with a system having a clamped inductive coupling circuit for coupling a gate driver circuit to a switching device, according to various examples. Signals shown in the FIG. 6B include examples of signals generated during the operation of the system 600. As shown in FIG. 6B, a voltage at the gate G of the switching device 620 can be controlled by toggling the switching device 610 and switching device 640 according to pulsed signals ON and OFF. More specifically, the profile of the voltage at the gate G, as this voltage rises to a threshold voltage level, can be determined by driving the gate or control terminal of switching device 640 low (e.g., inhibiting current flow through the switching device 640) using OFF, while driving the gate or control terminal switching device 610 with the pulse modulated signal ON. Similarly, the profile of the voltage at the gate G, as this voltage falls below the threshold voltage level, can be determined by driving the gate or control terminal of switching device 610 low (e.g., inhibiting current flow through the switching device 610) using ON, while driving the gate switching device 640 with the pulse modulated signal OFF.

Figure 7A:
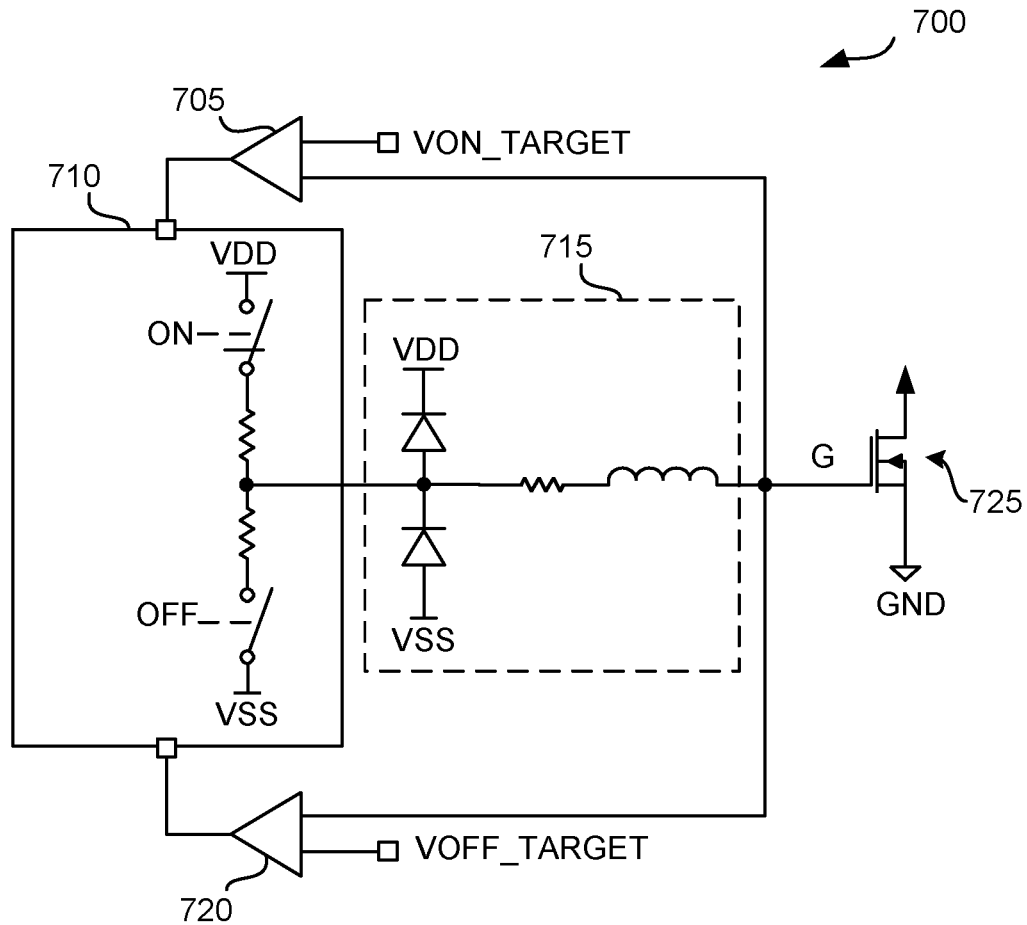
FIG. 7A depicts an example of a system having a clamped inductive coupling circuit with feedback for coupling a driver circuit to a switching device, according to various embodiments

FIG. 7A depicts an example of a system 700 having an inductive coupling circuit 715 with feedback for coupling a gate driver circuit 710 to a switching device 725, according to various examples. The system 700 can be an example of the system 600, where the system 600 is modified to include one or more feedback elements 705 and 720. The system 700 can also be an example of the system 500. In such an example, the coupling circuit 715 can be replaced with the coupling circuit 535 (FIG. 5), and opposing switches 510 and 530 can be alternately turned on (e.g., closed) to provide the clamping function of the clamping diodes shown in the coupling circuit 715. The feedback elements can include voltage comparators that are configured to compare a sample of the gate voltage of the switching device 725 to one or more target voltages VON_TARGET or VOFF_TARGET and to provide an output of the comparison to the gate driver circuit 710, so as to determine when to turn off the gate G to prevent overshoot. In some examples, VON_TARGET or VOFF_TARGET can be used to adjust the modulation of pulsed signals ON or OFF, respectively, based on the gate voltage of the switching device 725.

Figure 7B:
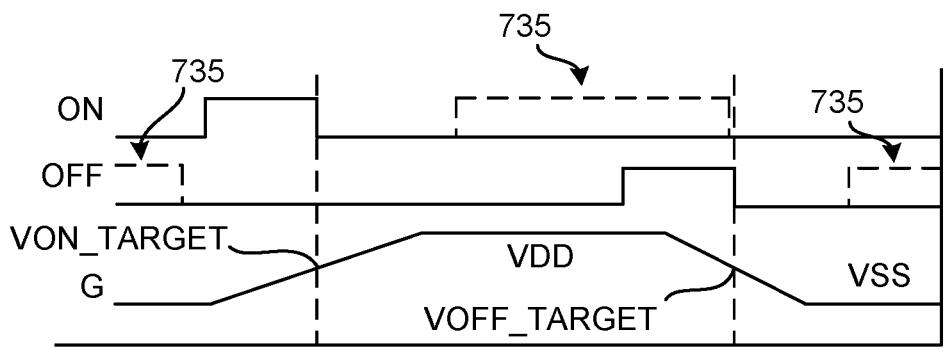
FIG. 7B depicts a diagram of signals associated with a system having a clamped inductive coupling circuit with feedback for coupling a driver circuit to a switching device, according to various examples.

FIG. 7B depicts a diagram of signals associated with a system having a clamped inductive coupling circuit with feedback for coupling a driver circuit to a switching device, according to various examples. Signals shown in the FIG. 7B can include examples of signals generated during the operation of certain configurations of the system 700. In such configurations, the pulsed signals ON or OFF can each be modulated with a single pulse, such as to charge or discharge the gate of the switching device 725. The width of the pulses can be determined using the gate voltage of the switching device 725. In some examples, the pulses can be terminated when the voltage at the gate G of the switching device 725 reaches a rising target voltage VON_TARGET or a falling target voltage VOFF_TARGET. In some examples, VON_TARGET and VOFF_TARGET, can be selected to control one or more electrical characteristic of the voltage at the gate G of the switching device 725, such as rise/fall time, the slew rate, or voltage magnitude.

Figure 8A:
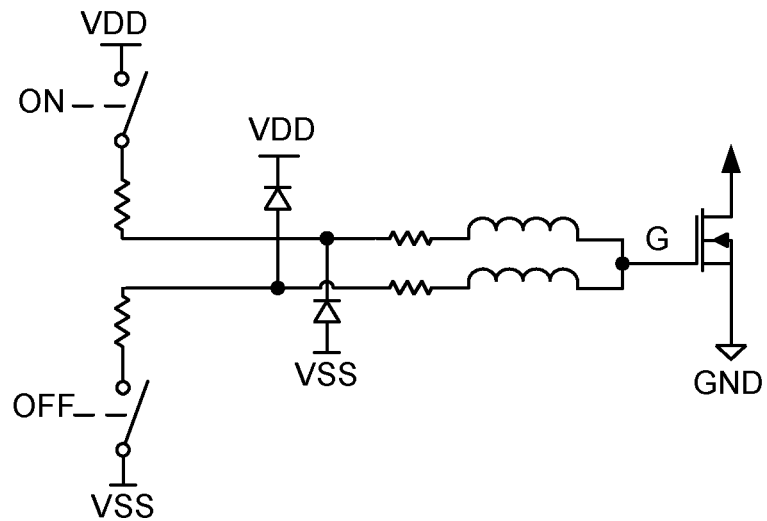
FIG. 8A and FIG. 8B depict examples of systems having inductive coupling circuits for coupling a driver circuit to a switching device, according to various examples.
Figure 8B:
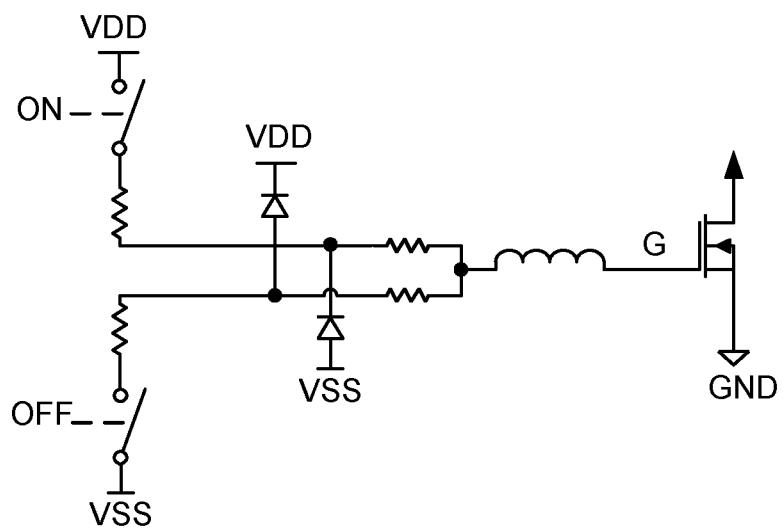

FIG. 8A and FIG. 8B depict examples of alternative configurations of the system 600 (FIG. 6A). The systems shown in FIG. 8A and FIG. 8B can operate in substantially the same way as the system 600. Additionally, the components used to fabricate the systems shown in in FIG. 8A and FIG. 8B can be selected according to the same criteria used to select the components of the system 600.

Figure 9:
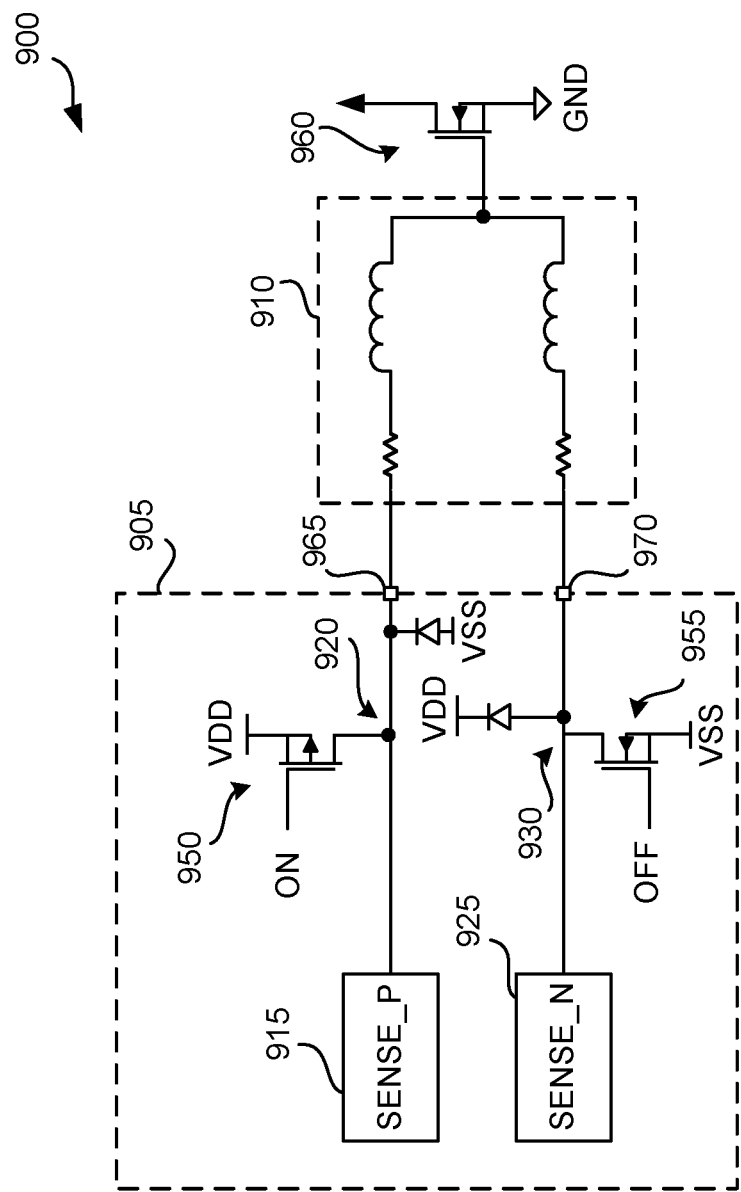
FIG. 9 depicts an example of a system having a gate driver circuit that is configured with one or more sensing circuits, according to various examples.

FIG. 9 depicts an example of a system 900 having a gate driver circuit 905 that is configured with one or more sensing circuits. Although the system 900 is shown with a specific configuration of the gate driver circuit 905 and coupling circuit 910, the system 900 can include any of the systems discussed in FIGS. 1-8, such that the gate driver 905 or the coupling circuit 910 can be configured as any of the gate driver circuits or coupling circuits depicted in FIGS. 1-8. The system 900 illustrates a technique for sensing or detecting feedback signals from the gate of the switching device 960. According this sensing technique, sensing circuit 915 can be coupled to the switching device 950 at node 920 and sensing circuit 925 can be coupled to the switching device 955 at node 930, such as to sense the gate voltage of the switching device 960. The sensing circuit 925 can sense the gate voltage of the switching device 960 that is fed back through terminal 970 while the switching device 950 drives the gate of switching device 960. Similarly, sensing circuit 915 can sense the gate voltage of the switch 960 that is fed back through terminal 965 while the switching device 955 drives the gate of the switching device 960 through terminal 970.

Figure 10:
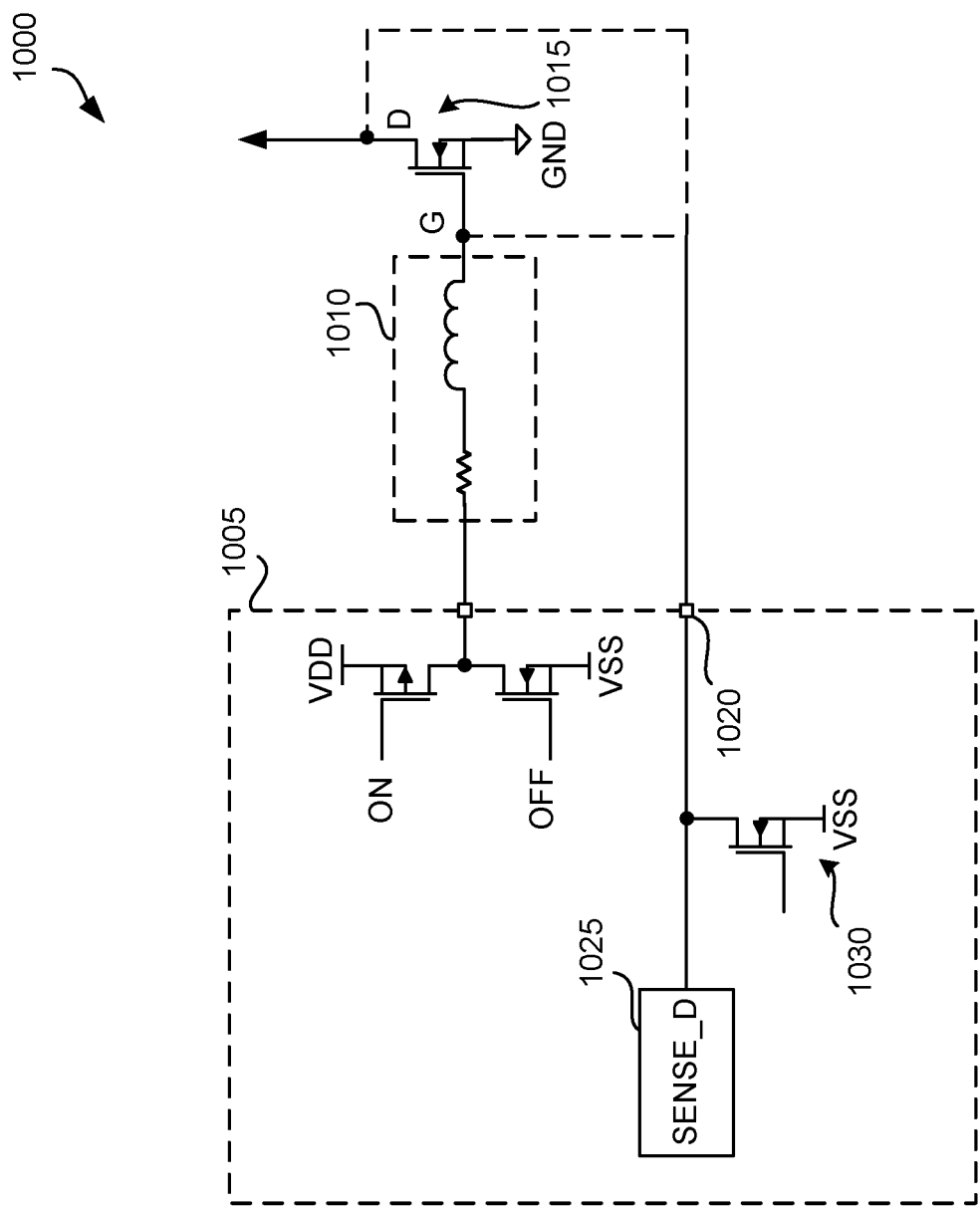
FIG. 10 depicts an example of a system having a gate driver circuit that is configured with one or more sensing circuits.

FIG. 10 depicts an example of a system 1000 having a gate driver circuit 1005 that is configured with one or more sensing circuits. Although the system 1000 is shown with a specific configuration of the gate driver circuit 1005 and coupling circuit 1010, the system 1000 can include any of the systems discussed in FIGS. 1-8, such that the gate driver 1005 or the coupling circuit 1010 can be configured as any of the gate driver circuits or coupling circuits depicted in FIGS. 1-8. The system 1000 illustrates a technique for sensing or detecting feedback signals from the gate or drain of the switching device 1015. According to a second feedback sensing technique, the gate driver circuit 1005 can be included in a device package that has one or more dedicated terminals 1020 for receiving a feedback signal from the coupling circuit 1010 or the switching device 1015. In an example, the feedback signal can be a voltage at the gate of the switching device 1015. In another example, the feedback signal includes a voltage or current sampled at the drain D of the switching device 1015. In other examples, the feedback signal includes a voltage or current that is sampled at another terminal or node of the coupling circuit 1010 or the switching device 1015. The sensing circuit 1025 can sense the feedback signal provided through terminal 1020 and provide an output to the gate driver circuit 1005, such as to adjust or control a pulse modulated signal used to drive the gate G of the switching device 1015.

In some examples, terminal 1020 can be coupled to one or more miller clamps to provide a low impedance path for any miller current generated by the system 1000, such as while switching the switching device 1015.

The sensing circuits 915, 925, or 1035 can include one or more circuits that are configured to sample, condition, compare, or otherwise evaluate a feedback signal. Such one or more circuits can also be configured to provide an output of the sampling, conditioning, comparing, or the evaluating to the driver circuit 905 or the driver circuit 1005, such as for use in controlling a pulsed signal used to drive the switching device 960 or switching device 1015.

Figure 11:
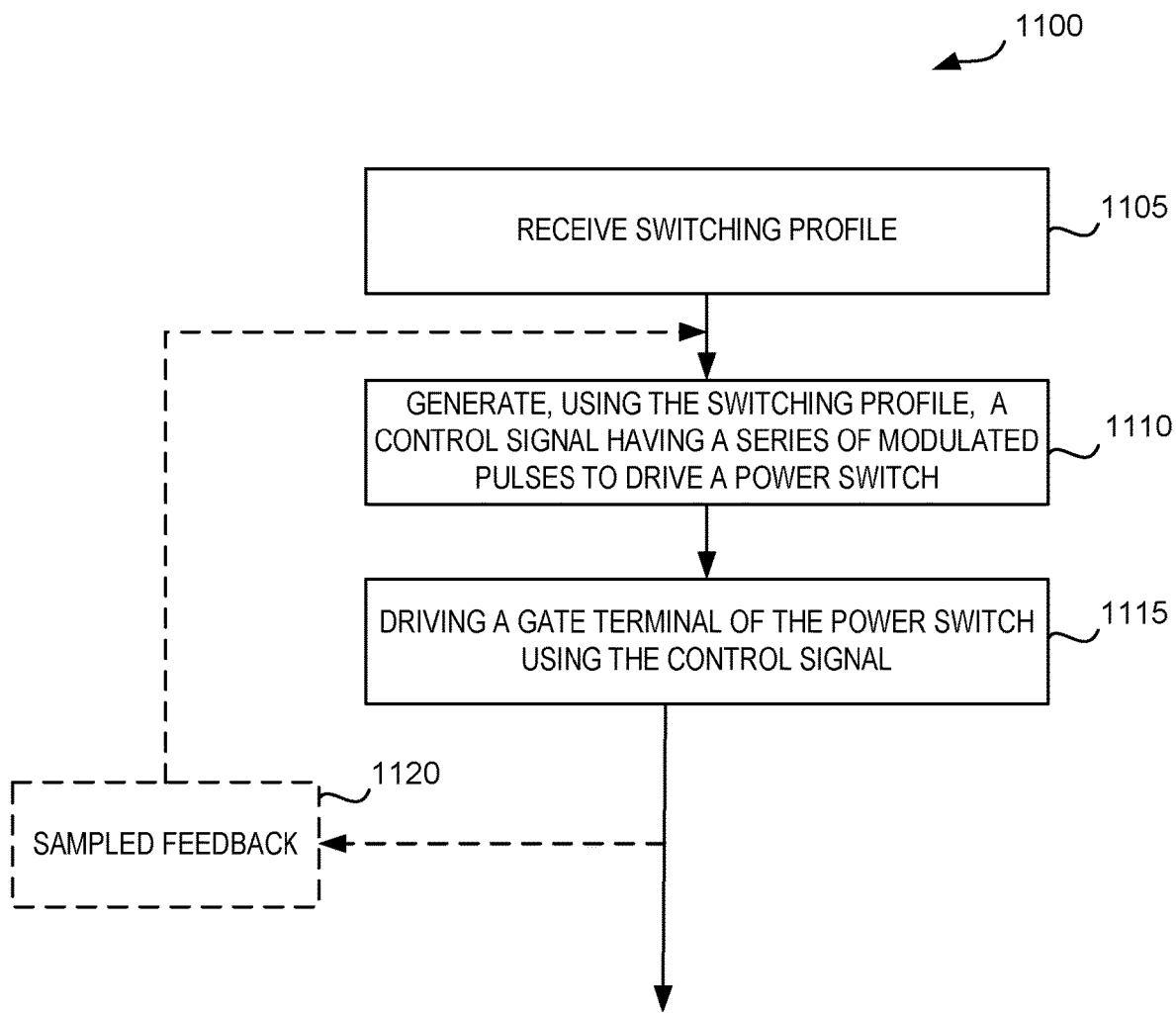
FIG. 11 depicts a set of operations for operating a system having a gate driver that is configured to control a switching device, according to various examples.

FIG. 11 depicts a set of operations 1100 for operating a system having a gate driver, such as the gate driver 905 or 1005, that is configured to control a switching device, such as the switching device 960 or 1015. The operations 1100 can be executed, such as by one or more digital or analog circuits, to perform or implement any of the techniques described herein. At 1105, a switching profile can be received. The switching profile can include a data object that indicates one or more desired switching characteristics of a switching device, such as a rise time, slew rate, a gate voltage profile, or a drain voltage or current profile. At 1110, a control signal can be generated based on the received switching profile indicator. The control signal can include a pulse modulated signal, as described herein. In some examples, the pulse modulated signal can include a series of one or more pulses whose pulse width, duty cycle, or frequency can be modulated to drive the gate of the switching device according to the switching profile. At 1115, the control signal can be provided, or coupled, to the gate or other control terminal of the switching device. In some examples, the control signal can be generated by the gate driver circuit and coupled to the switching device though a coupling circuit, as described herein. In some examples, a voltage or current associated with the switching device can be sampled and used to adjust the control signal used to drive the gate of the switching device, as shown at 1120.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented, at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. A circuit to control a switching characteristic of a switching device, the circuit comprising:
the switching device;
a driver circuit having an output port, the driver circuit comprising:
a first circuit to generate a series of two or more electrical pulses that are configured to provide a charge to actuate the switching device to switch from a first conductive state to a second conductive state, and
a second circuit to modulate a pulse density of the series of two or more electrical pulses to establish a target switching characteristic of the switching device; and
a coupling circuit coupled to the second circuit and to a control terminal of the switching device, the coupling circuit having an electrical impedance to the series of two or more electrical pulses that is larger than an output impedance of the driver circuit, the coupling circuit configured to establish, using a charge provided by at least two electrical pulses of the series of two or more electrical pulses, a switching voltage at the control terminal of the switching device to obtain the target switching characteristic of the switching device, wherein a magnitude of the switching voltage is indicative of the pulse density of the series of two or more electrical pulses.

2. The circuit of claim 1, wherein the target switching characteristic of the switching device comprises at least one of:
a rise time or a fall time of a voltage at the control terminal of the switching device; or
a rise time or a fall time of an output voltage or output current of the switching device.

3. The circuit of claim 1, wherein the switching device comprises a field effect transistor (FET) and the target switching characteristic of the switching device that is established according to the modulation of the series of two or more electrical pulses comprises at least one of a time varying amplitude of:
a gate voltage of the FET; or
a drain voltage or drain current of the FET.

4. The circuit of claim 1, wherein the coupling circuit comprises a resistive element that is configured to couple the at least two electrical pulses from the driver circuit to the control terminal of the switching device.

5. The circuit of claim 1, wherein the coupling circuit comprises an inductive element that is configured to couple the at least two electrical pulses from the driver circuit to the control terminal of the switching device.

6. The circuit of claim 5, wherein the coupling circuit further comprises a clamping device that is configured to conduct a discharging current of the inductive element to a power supply node.

7. The circuit of claim 1, wherein the driver circuit further comprises a sensing circuit that is configured to detect an indicator of the target switching characteristic, the driver circuit configured to adjust modulation of the pulse density of the series of two or more electrical pulses based on the detected indicator of the target switching characteristic.

8. The circuit of claim 7, wherein the switching device comprises a FET and the sensing circuit is configured to detect a voltage at a drain of the FET responsive to the two or more electrical pulses.

9. The circuit of claim 7, wherein the switching device comprises a FET and the sensing circuit is configured to detect a voltage at a gate of the FET responsive to the coupling circuit establishing the switching voltage.

10. The circuit of claim 1, wherein the coupling circuit is configured to dissipate a majority of electrical power in the two or more electrical pulses.

11. The circuit of claim 1, wherein the series of two or more electrical pulses has a duration that is shorter than a transition time to switch the switching device from the first conductive state to the second conductive state.

12. A gate driver circuit to drive a gate of a field effect transistor (FET), the gate driver circuit comprising:
the FET;
an integrated drive circuit comprising:
a pull-up circuit coupled to a first power supply node,
a pull-down circuit coupled to a second power supply node,
an output terminal coupled to the pull-up circuit and the pull-down circuit, and
a control circuit comprising:
a first input circuit to receive a control signal comprising an indicator to switch to switch the FET from a first conductive state to a second conductive state;
an actuator circuit to actuate, responsive to the indicator of the control signal, the pull-up circuit and the pull-down circuit to generate two or more electrical current pulses, the two or more electrical current pulses configured to collectively charge a gate terminal of the FET to switch the FET from the first conductive state to the second conductive state according to a target switching characteristic of the FET; and
a coupling circuit configured to couple the two or more electrical current pulses to a gate terminal of the FET and to dissipate a majority of electrical power of the two or more electrical current pulses outside of the integrated drive circuit.

13. The gate driver circuit of claim 12, wherein the driver circuit further comprises a feedback circuit that is configured to detect a signal at a drain or source terminal of the FET, the control circuit further comprising a modulator circuit to adjust a modulation of the two or more electrical current pulses based on the detected signal.

14. The gate driver circuit of claim 12, wherein the integrated drive circuit further comprises a feedback circuit to detect a voltage coupled to the gate terminal of the FET, the control circuit further comprising a modulation circuit to adjust a modulation of the two or more electrical current pulses based on the detected voltage.

15. The gate driver circuit of claim 12, wherein the coupling circuit comprises a resistor that is coupled to the output of the integrated drive circuit and the gate terminal of the FET.

16. The gate driver circuit of claim 12, wherein the coupling circuit comprises an inductor that is coupled to the output of the integrated drive circuit and the gate terminal of the FET.

17. The gate driver circuit of claim 12, wherein the two or more electrical current pulses comprise a pullup signal and a pulldown signal, and the output terminal comprises:
a first terminal that provides the pullup signal; and
a second terminal that that provides the pulldown signal.

18. The gate driver circuit of claim 17, further comprising:
a first feedback circuit that is configured to use the first terminal to detect a voltage that is coupled to the gate terminal of the FET when the pulldown signal is coupled to the gate terminal, and
a second feedback circuit that is configured to use the second terminal to detect the voltage that is coupled to the gate terminal of the FET when the pullup signal is coupled to the gate terminal.

19. The gate driver of claim 12, wherein the two or more electrical current pulses have a duration that is shorter than a rise time or fall time of the FET when the FET is switched from the first conductive state to the second conductive state.

20. The circuit of claim 12, wherein the indicator of the of the control signal includes an electrical pulse.

21. The circuit of claim 12, further comprising a second input circuit to receive a second signal that is indicative of the target switching characteristic of the FET, the actuator circuit further configured to actuate, responsive to the received control signal and the received indicator signal, the pull-up circuit and the pull-down circuit to generate the two or more electrical current pulses.

22. A method for driving a control terminal of a switching circuit to control a switching profile of the switch, the method comprising:
obtaining the switching circuit;
receiving an indicator of a target switching profile of the switching circuit;

receiving a control signal to drive the switching circuit from a first conductive state to a second conductive state;

generating, at an output of an integrated drive circuit responsive to receiving the control signal and the indicator, a drive signal to drive the control terminal according to the target switching profile by modulating a series of two or more current pulses of the drive signal responsive to the received indicator, the series of two or more current pulses having a series duration that is shorter than an indicated transition time of the switching circuit; and establishing, using a coupling circuit disposed outside the integrated drive circuit, a switching voltage at the control terminal of the switching circuit using a charge of the series of two or more current pulses, and dissipating a majority of electrical power of the series of two or more current pulses outside of the integrated drive circuit.

23. The method of claim 22, further comprising:

detecting an indicator of a switching profile of the switching circuit; and adjusting the modulation of the series of two or more current pulses of the control signal based on the detected indicator.

24. The method of claim 22, wherein the switching profile is indicative of:

a rise time of a voltage at the gate terminal;

a fall time of the voltage at the gate terminal;

a rise time of a voltage or current that is controlled by the switching circuit; or a fall time of the voltage or current that is controlled by the switching circuit.

* * * * *